US012772430B2

(12) United States Patent
Shao et al.

(10) Patent No.: US 12,772,430 B2
(45) Date of Patent: Oct. 20, 2026

(54) CAPACITOR STACK STRUCTURE AND METHOD FOR FORMING SAME

(71) Applicant: CHANGXIN MEMORY TECHNOLOGIES, INC., Hefei City (CN)

(72) Inventors: Guangsu Shao, Hefei (CN); Deyuan Xiao, Hefei (CN); Weiping Bai, Hefei (CN); Yunsong Qiu, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 954 days.

(21) Appl. No.: 17/950,201

(22) Filed: Sep. 22, 2022

(65) Prior Publication Data

US 2023/0016558 A1 Jan. 19, 2023

Related U.S. Application Data

(63) Continuation of application No. PCT/CN2022/102537, filed on Jun. 29, 2022.

(30) Foreign Application Priority Data

May 12, 2022 (CN) ......................... 202210518053.7

(51) Int. Cl.
*H10B 12/00* (2023.01)

(52) U.S. Cl.
CPC ............. *H10B 12/03* (2023.02); *H10B 12/30* (2023.02)

(58) Field of Classification Search
CPC ........ H10B 12/03; H10B 12/30; H10B 12/05; H10B 12/00; H10D 1/714; H10D 1/68; H10N 97/00
See application file for complete search history.

(56) References Cited

U.S. PATENT DOCUMENTS

| | | | |
|---|---|---|---|
| 11,094,699 | B1 | 8/2021 | Brewer |
| 2019/0074277 | A1 | 3/2019 | Ramaswamy |

(Continued)

FOREIGN PATENT DOCUMENTS

| | | | |
|---|---|---|---|
| CN | 110890371 | A | 3/2020 |
| CN | 113748527 | A | 12/2021 |

(Continued)

*Primary Examiner* — Steven B Gauthier
*Assistant Examiner* — Sun Mi Kim King
(74) *Attorney, Agent, or Firm* — SYNCODA LLC; Feng Ma

(57) ABSTRACT

The method for forming the capacitor stack structure includes: providing a substrate on which a plurality of first laminated structures arranged in a first direction and a first isolation structure located between every two adjacent the first laminated structures are formed, and the first laminated structure including first semiconductor layers and second semiconductor layers stacked alternately; forming, in the first laminated structures and the first isolation structures, first trench extending in the first direction, the spacing in a second direction between the adjacent remaining first semiconductor layers is greater than the spacing between the adjacent remaining second semiconductor layers; forming a support structure in the first trench, and removing the first semiconductor layers from the first laminated structure to form a first space; and forming capacitor structures in the first space to form a capacitor stack structure.

9 Claims, 37 Drawing Sheets

(56) References Cited

U.S. PATENT DOCUMENTS

| | | | | |
|---|---|---|---|---|
| 2019/0103407 | A1* | 4/2019 | Kim | H10B 12/30 |
| 2020/0083225 | A1 | 3/2020 | Ma et al. | |
| 2020/0388617 | A1 | 12/2020 | Ramaswamy | |
| 2022/0093626 | A1 | 3/2022 | Shin et al. | |
| 2022/0254714 | A1* | 8/2022 | Lu | H01G 4/012 |
| 2022/0352167 | A1 | 11/2022 | Ramaswamy | |
| 2023/0015279 | A1* | 1/2023 | Shao | G11C 5/063 |

FOREIGN PATENT DOCUMENTS

| | | | |
|---|---|---|---|
| CN | 114121819 | A | 3/2022 |
| CN | 114203715 | A | 3/2022 |

* cited by examiner

CAPACITOR STACK STRUCTURE AND METHOD FOR FORMING SAME

CROSS-REFERENCE TO RELATED APPLICATION

This is a continuation application of International Patent Application No. PCT/CN2022/102537, filed on Jun. 29, 2022, which claims priority to Chinese Patent Application No. 202210518053.7, filed on May 12, 2022 and entitled "CAPACITOR STACK STRUCTURE AND METHOD FOR FORMING SAME". The disclosures of International Patent Application No. PCT/CN2022/102537 and Chinese Patent Application No. 202210518053.7 are incorporated by reference herein in their entireties.

TECHNICAL FIELD

The disclosure relates, but is not limited, to a capacitor stack structure and a method for forming the same.

BACKGROUND

With the development trend of chip miniaturization and integration, it is required to increase the number of capacitor structures in a limited space. A Two Dimensional (2D) Dynamic Random Access Memory (DRAM) cannot meet the requirement. Therefore, it is required to provide a method for forming a capacitor stack structure to promote the development of a memory to Three Dimensional (3D).

SUMMARY

In view of this, the embodiments of the disclosure provide a capacitor stack structure and a method for forming the same.

In a first aspect, the embodiments of the disclosure provide a method for forming a capacitor stack structure, which includes: providing a substrate, on which a plurality of first laminated structures arranged in a first direction and a first isolation structure located between adjacent first laminated structures are formed, wherein the first laminated structure comprises first semiconductor layers and second semiconductor layers stacked alternately; forming, in the first laminated structures and the first isolation structures, a first trench extending in the first direction, wherein in a second direction, a spacing between the adjacent remaining first semiconductor layers is greater than a spacing between the adjacent remaining second semiconductor layers; forming a support structure in the first trench, and removing the first semiconductor layers in the first laminated structure to form a first space; and forming capacitor structures in the first space, to form a capacitor stack structure.

In a second aspect, the embodiments of the disclosure provide a capacitor stack structure, which includes: a substrate, a support structure, second semiconductor strips, and capacitor structures. The support structure is located on the substrate and extends in the first direction, the second semiconductor strips are located on two sides of the support structure and arranged in arrays, the second semiconductor strips extend in the second direction, the capacitor structures are located between two adjacent rows of the second semiconductor strips in the second direction. The support structure is configured to support the second semiconductor strips. The spacing between the two second semiconductor strips on two sides of the support structure and in the same row in the second direction is less than the maximum dimension of the support structure in the second direction.

BRIEF DESCRIPTION OF THE DRAWINGS

In the drawings (which are not necessarily drawn to scale), similar drawing signs may describe similar parts in different views. Similar drawing signs with different letter suffixes may represent different examples of similar parts. The drawings generally illustrate the various embodiments discussed herein by way of examples rather than limitation.

DETAILED DESCRIPTION

Figure 1:
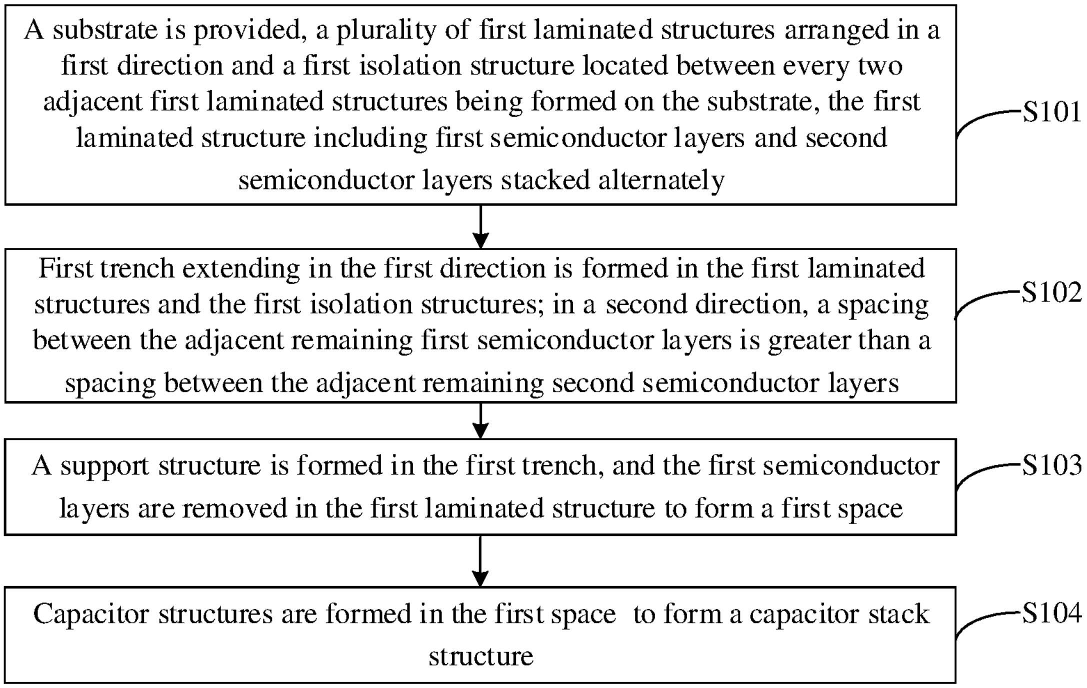
FIG. 1 illustrates a schematic flowchart of a method for forming a capacitor stack structure provided by the embodiments of the disclosure.

Exemplary implementation modes of the disclosure will be described below in more detail with reference to the drawings. Although the exemplary implementation modes of the disclosure are shown in the drawings, it should be understood that, the disclosure may be implemented in various forms and should not be limited by the specific implementation modes elaborated herein. On the contrary, these implementation modes are provided to enable a more thorough understanding of the disclosure and to fully convey the scope of the disclosure to those skilled in the art.

In the following description, a large number of specific details are given in order to provide a more thorough understanding of the disclosure. However, it will be apparent to those skilled in the art that the disclosure may be implemented without one or more of these details. In other examples, in order to avoid confusion with the disclosure, some technical features known in the art are not described. That is, all the features of the actual embodiments are not described here, and the known functions and structures are not described in detail.

In the drawings, the dimensions of layers, areas, and elements and their relative dimensions may be exaggerated for clarity. Throughout, the same drawing signs represent the same elements.

It is to be understood that description that an element or layer is "above", "adjacent to", "connected to", or "coupled to" another element or layer may refer to that the element or layer is directly above, adjacent to, connected to or coupled to the other element or layer, or there may be an intermediate element or layer. On the contrary, description that an element is "directly on", "directly adjacent to", "directly connected to" or "directly coupled to" another element or layer refers to that there is no intermediate element or layer. It is to be understood that, although various elements, components, areas, layers, and/or parts may be described with terms first, second, third, etc., these elements, components, areas, layers, and/or parts should not be limited to these terms. These terms are used only to distinguish one element, component, area, layer or part from another element, component, area, layer or part. Therefore, a first element, component, area, layer, or part discussed below may be represented as a second element, component, area, layer, or part without departing from the teaching of the disclosure. However, when the second element, component, area, layer, or part is discussed, it does not mean that the first element, component, area, layer, or part must exist in the disclosure.

The terms used herein are intended only to describe specific embodiments and are not a limitation of the disclosure. As used herein, singular forms "a/an", "one", and "the" may also be intended to include the plural forms, unless otherwise specified types in the context. It is also to be understood that, when terms "composed of" and/or "including" are used in this specification, the presence of the features, integers, steps, operations, elements, and/or components may be determined, but the presence or addition of one or more other features, integers, steps, operations, elements, components, and/or groups is also possible. As used herein, terms "and/or" includes any and all combinations of the related listed items.

Before introducing the embodiments of the disclosure, three directions for describing the three-dimensional structure that may be used in the following embodiments should be defined. Taking a Cartesian coordinate system as an example, the three directions may include an X-axis direction, a Y-axis direction, and a Z-axis direction. In a top surface and a bottom surface (that is, the plane on which the substrate is located) of the substrate, two directions that intersect each other (e.g., perpendicular to each other) are defined. For example, the arrangement direction of first stack structures may be defined as a first direction, an extending direction of the first stack structures may be defined as a second direction, and a plane direction of the substrate may be determined on the basis of the second direction and the first direction. The substrate may include a top surface located on a front side and a bottom surface located on a back side opposite to the front side. The direction perpendicular to the top surface and the bottom surface of the substrate is defined as the third direction in a case of ignoring the flatness of the top surface and the bottom surface. It can be seen that every two of the first direction, the second direction, and the third direction are perpendicular to each other in pairs. In the embodiments of the disclosure, the first direction is defined as an X-axis direction, the second direction is defined as the Y-axis direction, and the third direction is defined as the Z-axis direction.

The embodiments of the disclosure provide a method for forming a capacitor stack structure, referring to FIG. 1, including the following S101 to S104.

At S101, a substrate is provided. A plurality of first laminated structures arranged in a first direction and a first isolation structure located between every two adjacent first laminated structures are formed on the substrate. The first laminated structure includes first semiconductor layers and second semiconductor layers stacked alternately.

The substrate may be a silicon base, a Silicon-On-Insulator (SOI) base, etc. The substrate may also include other semiconductor elements or semiconductor compounds such as silicon carbide (SiC), gallium arsenide (GaAs), gallium phosphide (GaP), indium phosphide (InP), indium arsenide (InAs) or indium antimonide (InSb), or other semiconductor alloys such as arsenic gallium phosphide (GaAsP), indium aluminum arsenide (AlInAs), gallium aluminum arsenide (AlGaAs), indium gallium arsenide (GaInAs), indium gallium phosphide (GaInP), and/or indium gallium arsenide phosphide (GaInAsP) or a combination thereof.

The first semiconductor layers and the second semiconductor layers may be stacked alternately to form a semiconductor superlattice. The thickness of each semiconductor layer varies from a few atoms to dozens of atomic layers, and the main semiconductor properties of each layer, such as a band gap and a doping level, can be independently controlled. The number of layers of the first semiconductor layers and the second semiconductor layers in the first laminated structure may be set according to the required capacitance density (or storage density). The greater the number of layers of the first semiconductor layers and the second semiconductor layers, the higher the integration degree of the formed 3D memory and the greater the capacitance density. During implementation, there may be four first semiconductor layers, and there may be three second semiconductor layers. The top layer of the first laminated structure is a first semiconductor layer. A capacitor structure will be formed on the top layer after the first semiconductor layer is removed. There may be three first semiconductor layers and three semiconductor layers, such that the top layer of the first laminated structure is a second semiconductor layer.

The material of the first semiconductor layer may be Germanium (Ge), Silicon Germanium (SiGe), or Silicon Carbide (SiC), or may also be a Silicon-On-Insulator (SOI) or a Germanium-on-Insulator (GOI). In the embodiments of the disclosure, the first laminated structure is described by taking a SiGe layer (that is, the first semiconductor layer)/a silicon layer (that is, the second semiconductor layer)/a SiGe layer/a silicon layer commonly used in a DRAM as an example.

The second semiconductor layer may be a silicon layer, or may also include other semiconductor compounds such as silicon carbide, gallium arsenide, gallium phosphide, indium phosphide, indium arsenide or indium antimonide, or include other semiconductor alloys such as silicon germanium, arsenic gallium phosphide, indium aluminum arsenide, gallium aluminum arsenide, indium gallium arsenide, indium gallium phosphide, and/or indium gallium arsenide phosphate, or a combination thereof.

In the embodiments of the disclosure, the first semiconductor layer in the first laminated structure needs to be etched and removed. and the second semiconductor layer needs to be remained in the subsequent formation of the first space, so that the first semiconductor layer and the second semiconductor layer should have different etching selectivity ratio.

At S102, the first trench extending in the first direction is formed in the first laminated structures and the first isolation structures. In a second direction, the spacing between the adjacent remaining first semiconductor layers is greater than the spacing between the adjacent remaining second semiconductor layers.

Here, the first trench is formed to form a support structure. The support structure may be configured to support the second semiconductor layers. Capacitor structures will be formed between adjacent second semiconductor layers in the third direction, so the support structure may also be configured to support the capacitor structures, thereby improving the stability of a capacitor stack structure.

In the second direction, the expression "the spacing between the adjacent remaining first semiconductor layers is greater than the spacing between the adjacent remaining second semiconductor layers" refers to that the remaining first semiconductor layers are concave, and the remaining second semiconductor layers are convex, that is, the side wall of the first trench is rugged (i.e. not flat).

At S103, a support structure is formed in the first trench, and the first semiconductor layers in the first laminated structure are removed, so as to form a first space.

Here, the remaining first semiconductor layers in the laminated structure after the first trench is formed are removed. One first space may be formed by removing one the remaining first semiconductor layers in one first laminated structure. After the first semiconductor layers in the first laminated structure are removed, the formed first space is to reserve a space for the capacitor structures.

A support material, such as silicon nitride or silicon oxynitride, is deposited in the first trench, so as to form a support structure. The side wall of the first trench is rugged, the contact area between the support structure and the second semiconductor layer may be increased, and part of the support material will be embedded into the concave part of the first trench, so as to improve the support effect of the support structure.

At S104, a capacitor structure is formed in the first space, so as to form capacitor stack structures.

During implementation, a lower electrode, a dielectric layer, and an upper electrode may be formed in the first space in sequence, so as form the capacitor structures. Each of the lower electrode, the dielectric layer, and the upper electrode extends in the second direction, so the capacitor structure formed in the first space is a horizontal capacitor structure, and a plurality of capacitors are stacked to form a capacitor stack structure in the Z-axis direction.

In the embodiments of the disclosure, firstly, the plurality of first laminated structures arranged in the first direction and the isolation structure located between adjacent the first laminated structures are formed on the substrate. The first laminated structure includes first semiconductor layers and second semiconductor layers stacked alternately, such that the first isolation structure may be configured to isolate adjacent first laminated structures, which can reduce leakage current. Secondly, the first trench extending in the first direction is formed in the first laminated structures and the first isolation structures, herein in the second direction, the spacing between the adjacent remaining first semiconductor layers is greater than the spacing between the adjacent remaining second semiconductor layers, such that side wall of the first trench may be rugged, and the contact area between a subsequently formed support structure and the second semiconductor layers can be increased, thereby improving a supporting effect of the support structure on the second semiconductor layers and/or the capacitor structure, and reducing the collapse of the capacitor structure. Finally, a support structure is formed in the first trench, and the first semiconductor layers in the first laminated structure are removed, so as to form a first space, and capacitor structures are formed in the first space. The capacitor structures extend in the second direction. In other words, each capacitor structure is parallel to the substrate, that is, the capacitor structure is horizontal. On one hand, compared with a vertical capacitor structure with a high aspect ratio (that is, the ratio of the height to the width or the diameter), the horizontal capacitor structure can reduce the possibility of toppling or breaking, so as to improve the stability of the capacitor structure; and on the other hand, the capacitor stack structure formed by stacking a plurality of capacitors in the vertical direction can form a three-dimensional memory, which can improve the integration degree of the memory and reduce the dimension of a semiconductor device, thereby realizing miniaturization.

In some embodiments, the operation of forming the substrate may include S1011 to S1013.

At S1011, a base is provided.

At S1012, initial first semiconductor layers and initial second semiconductor layers are alternately stacked on the base, so as to form an initial first laminated structure. The initial first semiconductor layer includes an initial silicon germanium layer, and the initial second semiconductor layer includes an initial silicon layer.

In the initial first laminated structure, there may be one initial first semiconductor layer and one initial second semiconductor layer. The initial first semiconductor layer may be an initial silicon germanium layer, and the initial second semiconductor layer may be an initial silicon layer. In some embodiments, in the initial first laminated structure, the initial first semiconductor layer may wrap the initial second semiconductor layer.

At S1013, first isolation structures arranged in the first direction are formed in the initial first laminated structure, so as to form the substrate.

In some embodiments, the operation of forming the substrate further includes the following S1014: ion implantation is performed on the initial silicon layer after the initial silicon layer is formed on the base. The ion implantation may be implemented by the processes such as thermal fusion and plasma doping. Ions in group VA, such as phosphorus, arsenic, and antimony, may be used, or ions in group IIIA, such as boron and indium, may be used. In the embodiments of the disclosure, the silicon layer originating from the original silicon layer will eventually serve as a connection channel between the lower electrode and the active area, the resistance of the original silicon layer can be reduced by performing the ion implantation on the initial silicon layer, thereby reducing the contact resistance between the lower electrode and the active area, and reducing the power consumption of a device.

Figure 2A:
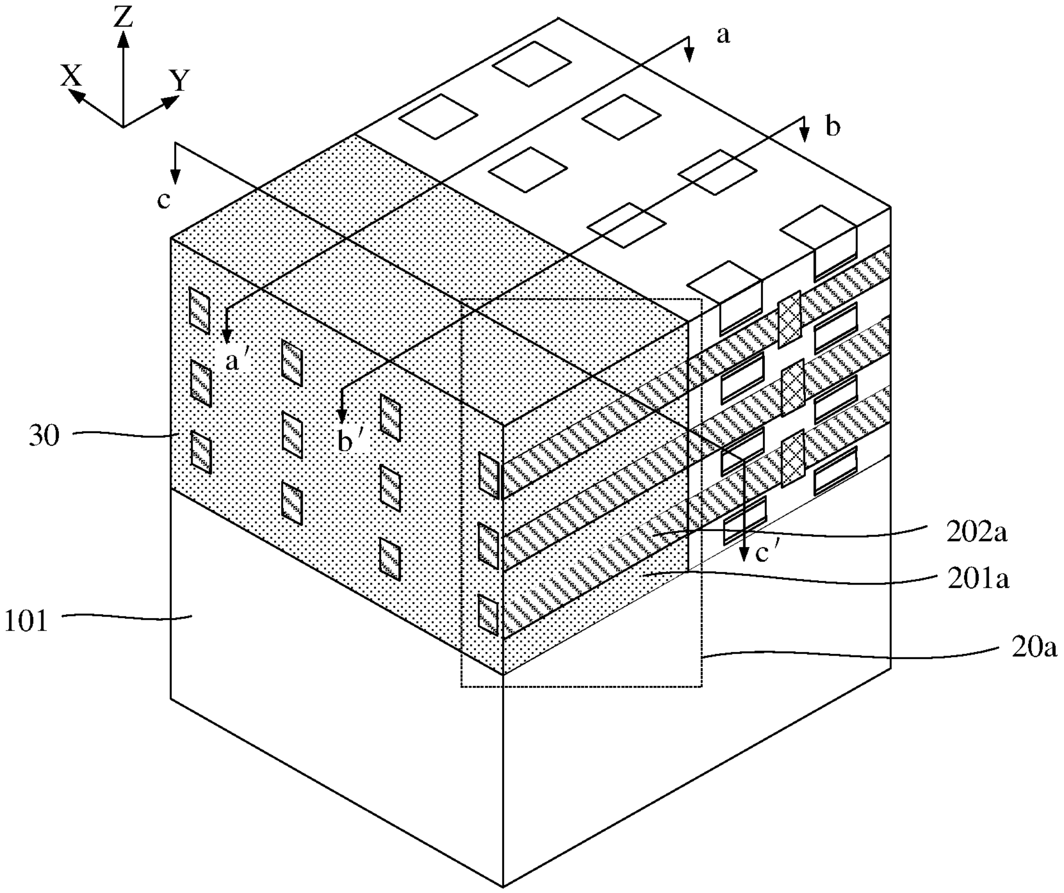
FIG. 2A illustrates a schematic view of a composition structure of a process for forming the capacitor stack structure provided by the embodiments of the disclosure.
Figure 2B:
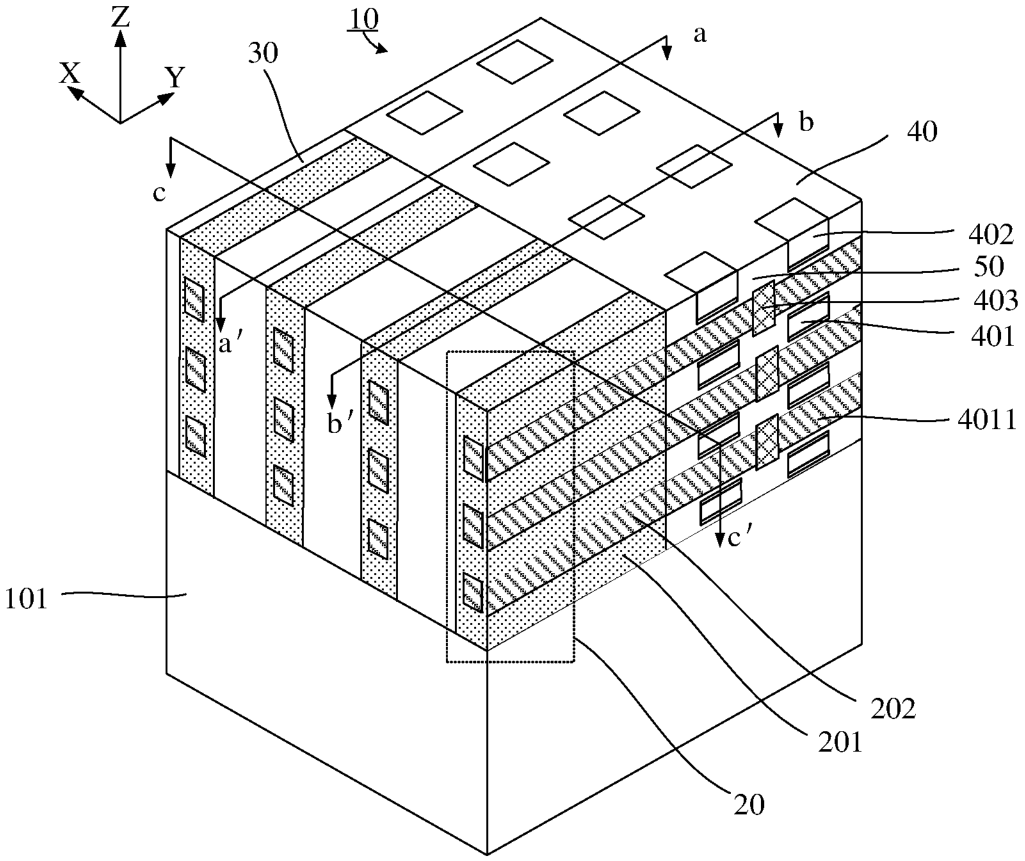
FIG. 2B illustrates another schematic view of a composition structure of a process for forming the capacitor stack structure provided by the embodiments of the disclosure.

S1011 to S1013 are explained and described with reference to FIG. 2A and FIG. 2B. Referring to FIG. 2A, firstly, a base 101 is provided. Initial first semiconductor layers 201*a* and initial second semiconductor layers 202*a* stacked alternately are formed on the base 101, so as to form an initial first laminated structure 20*a*. Secondly, first isolation structures 30 arranged in the X-axis direction as shown in FIG. 2B are formed in the initial first laminated structure 20*a*, so as to form a substrate 10. During implementation, the initial first laminated structure 20*a* may be etched in the Z-axis direction to form the trenches arranged in the first direction, each trench extending in the second direction. Then the trenches are filled with an isolation material (such as silicon oxide, silicon nitride, or silicon oxynitride) to form first isolation structures 30. A plurality of first laminated structures 20 arranged in the first direction and the first isolation structures 30 located between adjacent first laminated structures 20 are formed on the substrate 10 in the embodiments of the disclosure. The first laminated structure 20 includes first semiconductor layers 201 and second semiconductor layers 202 stacked on one another.

In some embodiments, continuing refer to FIG. 2B, a transistor area 40 and second isolation structures 50 located between adjacent transistors 401 in the second direction are also formed on the substrate 10. The second semiconductor layer 202 in the first laminated structure 20 extends to the transistor area 40 to serve as an active layer 4011 of the transistor area 40. The transistor 401 in the transistor area 40 includes a source, a drain, and a gate-all-around structure surrounding the active layer. The gate-all-around structure includes a gate and a word line. Compared with the other gate structure, the gate-all-around structure on one hand is controlled from the periphery of a trench, so the gate-all-around structure can enhance the control capability of the gate, and the dimension of a gate structure can be further reduced, thereby overcoming the limitations to physical scaling and performance in the prior art. In addition, the dimension of the gate structure can be further reduced due to the gate-all-around structure, so the dimension of a semiconductor device can be further reduced.

In some embodiments, word line 402 and bit lines 403 are also formed on the substrate. The bit lines 403 are formed in the active layers 4011 of the transistor area 40. The word lines 402 are formed between adjacent active layers 4011. The second isolation structures 50 are also configured to isolate the adjacent word lines 402.

In some embodiments, continuing to refer to FIG. 2B, in the second direction, the word lines 402 are formed on two sides of the bit line 403, that is to say, a transistor 401 is arranged on the left side of the bit line 403 and a transistor 401 is arranged on the right side of the bit line 403, and the two transistors 401 can share one bit line 403. Compared with the case that various transistors are connected to different bit lines, the two transistors in the embodiments of the disclosure share one bit line, so that the number of the bit lines can be reduced, thereby realizing further miniaturization of the semiconductor device.

In some embodiments, S102 may be implemented by the following S1021 and S1022.

At S1021, a first sub-trench extending in the first direction is formed in the first laminated structures and the first isolation structures. Here, the first sub-trench may be formed by a dry process (such as a plasma etching process, a reactive ion etching process, or an ion beam milling process) or wet etching process. The gas used in dry etching may be one or a combination of trifluoromethane ($CHF_3$), carbon tetrafluoride ($CF_4$), difluoromethane ($CH_2F_2$), hydrobromic acid (HBr), chlorine ($Cl_2$) or sulfur hexafluoride ($SF_6$).

Referring to FIG. 3A, FIG. 3B, FIG. 3C, FIG. 3D, and FIG. 3E, the first sub-trench 60*a* extending in the X-axis direction is formed in the first laminated structures 20 and the first isolation structures 30. In addition, it can be seen from FIG. 3E that the first semiconductor layer 201 surrounds the second semiconductor layer 202.

At S1022, a part of each first semiconductor layer in the first sub-trench in the first laminated structure is etched in the second direction, so as to form the first trenches. Here, the part of the first semiconductor layer in the first laminated structure may be removed by wet etching.

Figure 3A:
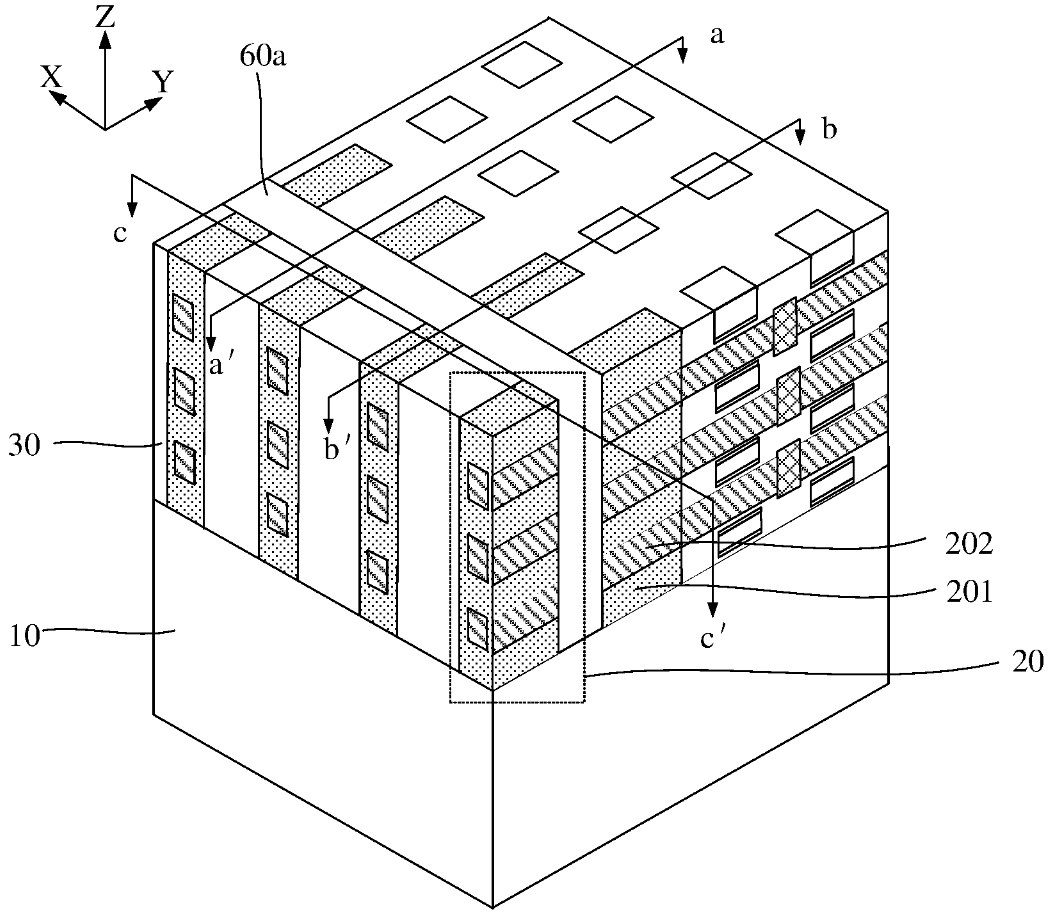
FIG. 3A illustrates another schematic view of a composition structure of a process for forming the capacitor stack structure provided by the embodiments of the disclosure.
Figure 3B:
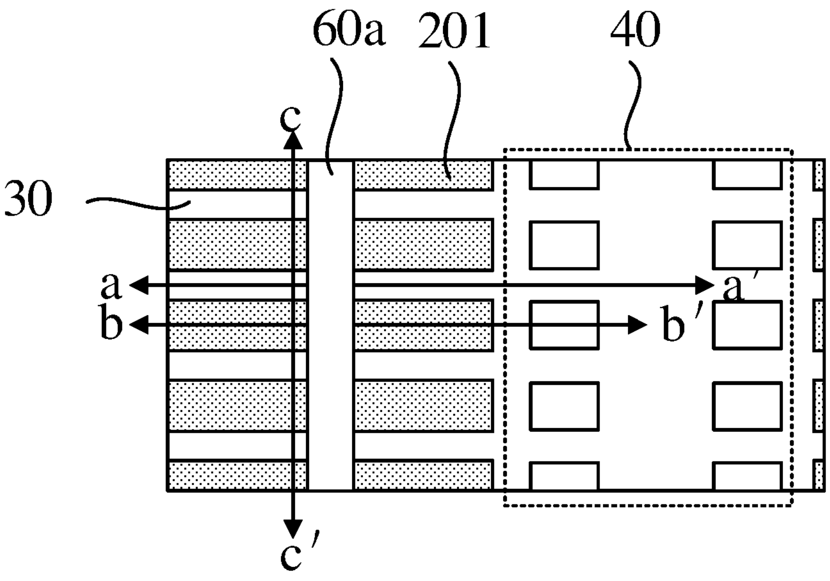
FIG. 3B to FIG. 3E respectively illustrate a vertical view, a sectional view in direction aa', a sectional view in direction bb', and a sectional view in direction cc' of FIG. 3A.
Figure 3C:
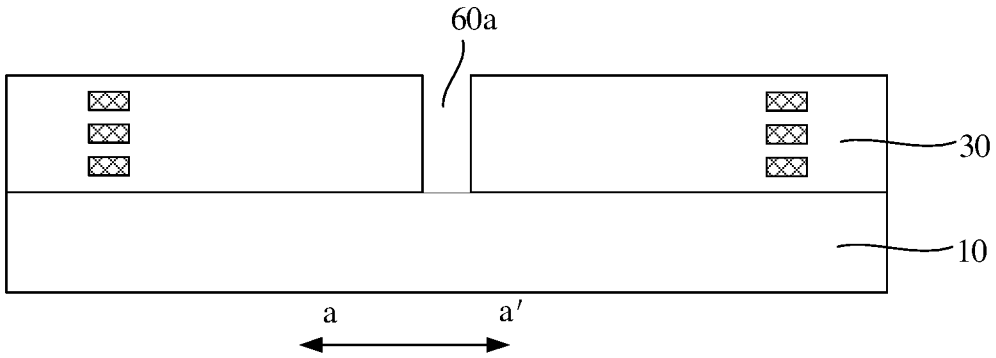
Figure 3D:
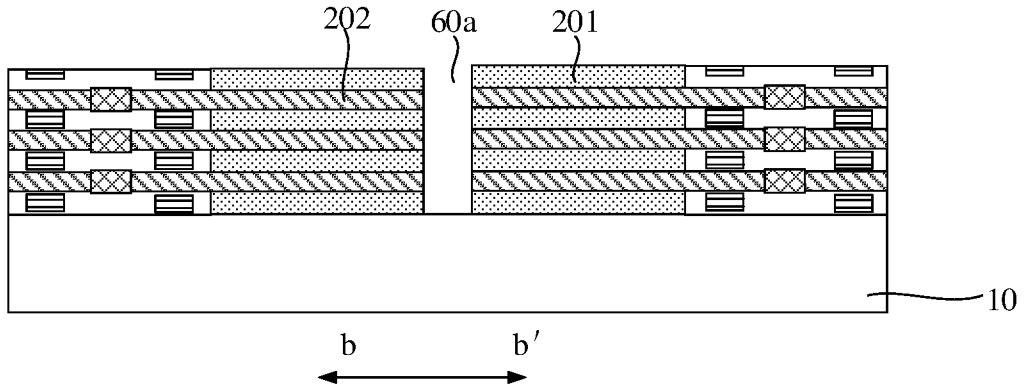
Figure 3E:
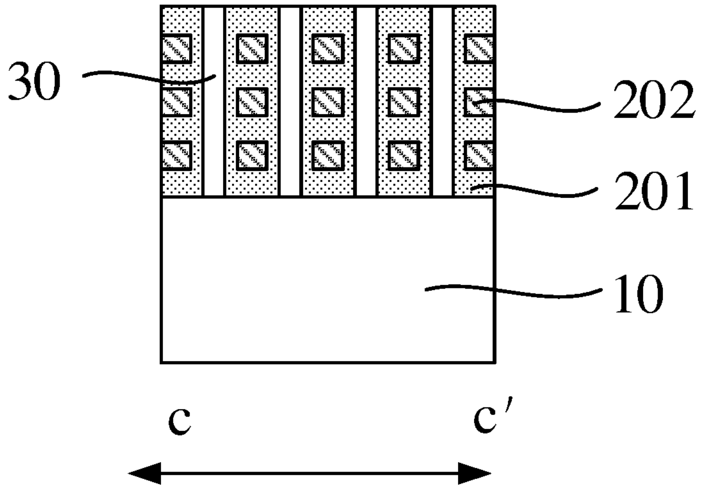
Figure 3F:
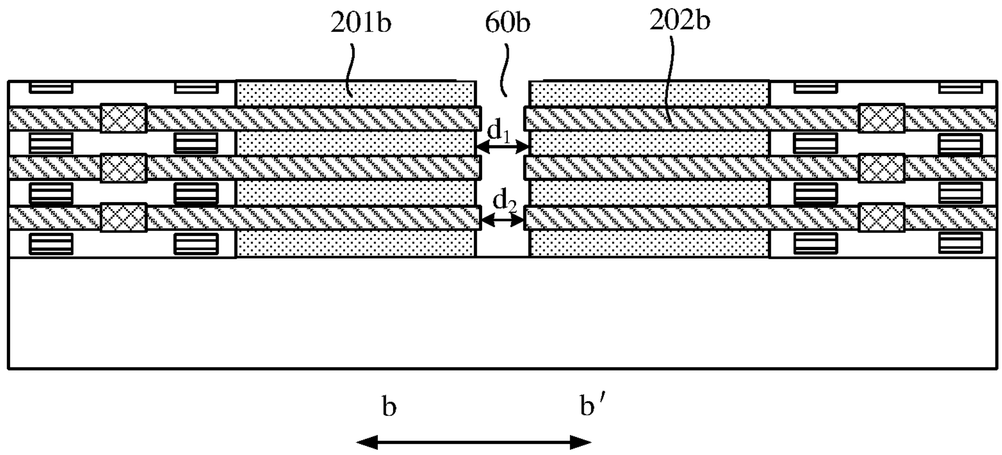
FIG. 3F illustrates another schematic view of a composition structure of a process for forming the capacitor stack structure provided by the embodiments of the disclosure.

Referring to FIG. 3D, a part of each first semiconductor layer 201 in the first sub-trench 60*a* in the first laminated structure 20 is etched in the Y-axis direction, so as to form the first trench 60*b* as shown in FIG. 3F. In the second direction, the spacing $d_1$ between the adjacent remaining first semiconductor layers 201*b* is greater than the spacing $d_2$ between the adjacent remaining second semiconductor layers 202*b*. The remaining first semiconductor layer 201*b* refers to the remaining part of the first semiconductor layer 201 after the first trench 60*b* is formed.

Figure 3G:
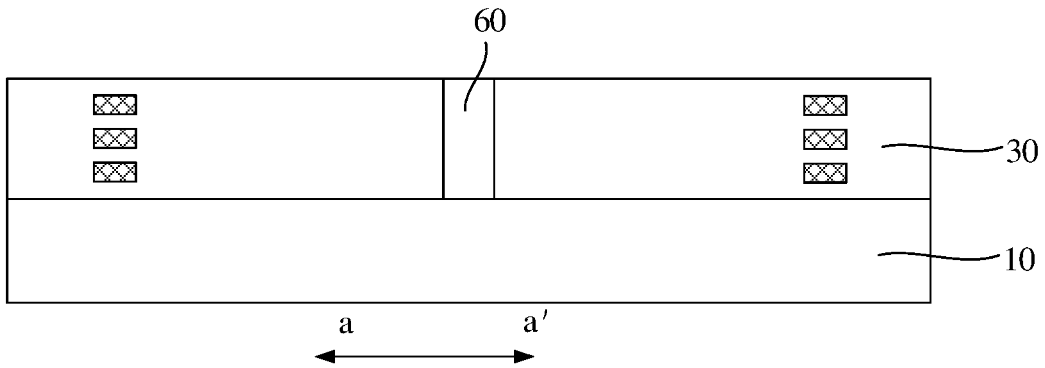
FIG. 3G illustrates another schematic view of a composition structure of a process for forming the capacitor stack structure provided by the embodiments of the disclosure.
Figure 3H:
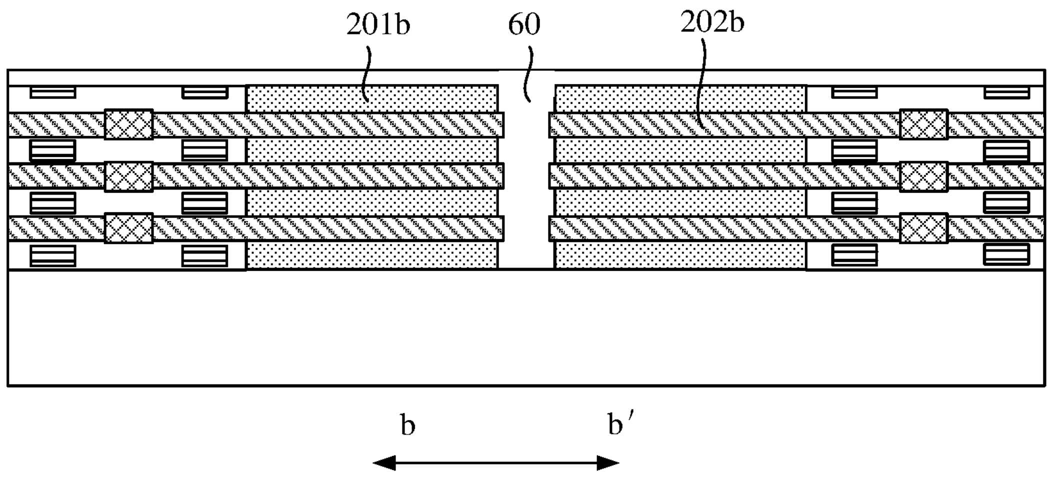
FIG. 3H illustrates a sectional view of FIG. 3G in direction bb'.
Figure 3I:
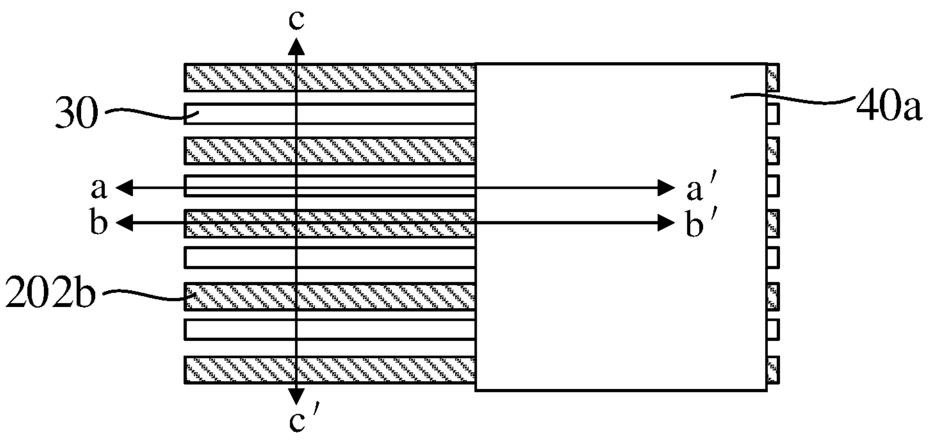
FIG. 3I illustrates another schematic view of a composition structure of a process for forming the capacitor stack structure provided by the embodiments of the disclosure.
Figure 3J:
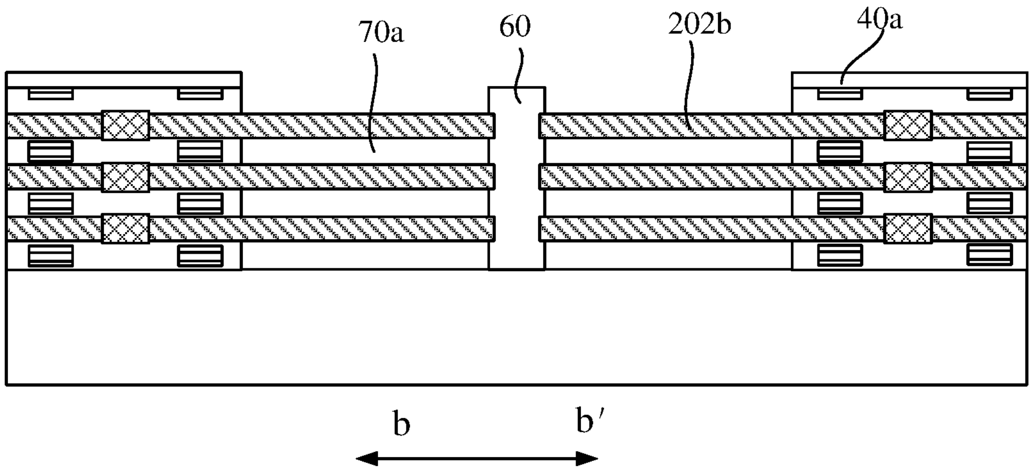
FIG. 3J and FIG. 3K respectively illustrate a sectional view 3I in direction bb' and a sectional view in direction cc' in FIG. 3I.
Figure 3K:
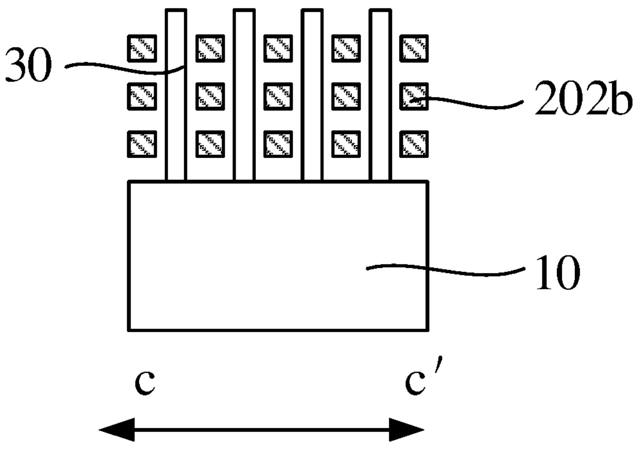

Referring to FIGS. 3G and 3H, a support structure 60 is formed in the first trench 60*b* (FIG. 3F). Referring to FIG. 3H, the remaining first semiconductor layer 201*b* in the first laminated structure 20 is removed to form a first space 70*a*, as shown in FIG. 3J. Comparing FIG. 3K with FIG. 3E, it can be found that there is no first semiconductor layer in FIG. 3K. Referring to FIG. 3I to FIG. 3J, the remaining second semiconductor layer 202*b* will be exposed after the first space 70*a* is formed. During implementation, a protective layer 40*a* may be formed on the transistor area, so as to protect the transistor area from damage. For example, the material of the protective layer may be silicon nitride or silicon oxide. After the first space 70*a* is formed, the sectional view in direction aa' is the same as FIG. 3G, which may be understood with reference to FIG. 3G.

Figure 3L:
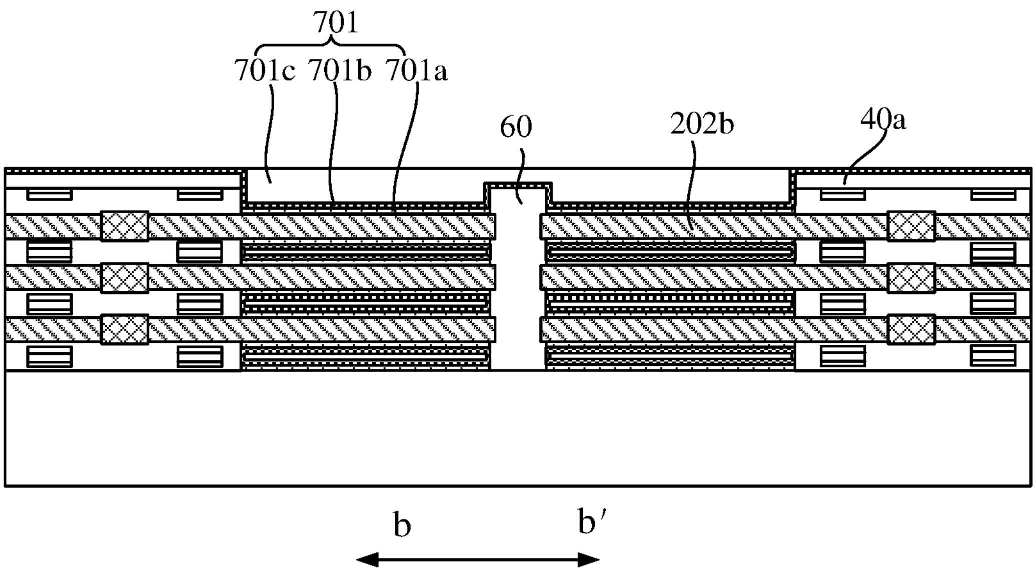
FIG. 3L illustrates another schematic view of a composition structure of a process for forming the capacitor stack structure provided by the embodiments of the disclosure.

Referring to FIG. 3J, capacitor structures 701 as shown in FIG. 3L are formed in the first space 70*a*, so as to form a capacitor stack structure. Each capacitor structure 701 includes a lower electrode 701*a*, a dielectric layer 701*b*, and an upper electrode 701*c*. It can be seen from FIG. 3L that two capacitor structures 701 at the top share the dielectric layer 701*b* and the upper electrode 701*c*. During implementation, the lower electrode material may be epitaxially formed in the first space and the dielectric material and the upper electrode material may be deposited in the first space in sequence, so as form the capacitor structures 701. The dielectric material and the upper electrode material may be formed by any one of the following deposition processes: a Chemical Vapor Deposition (CVD) process, a Physical Vapor Deposition (PVD) process, and an Atomic Layer Deposition (ALD) process. The upper electrode material and the lower electrode material may include a metal nitride or a metal silicide, such as titanium nitride (TiN). The dielectric material may include a high-K dielectric material, for example, may be one or any combination of lanthanum oxide ($La_2O_3$), aluminum oxide ($Al_2O_3$), hafnium oxide ($HfO_2$), hafnium oxynitride (HfON), hafnium silicate ($HfSiO_x$) or zirconium oxide ($ZrO_2$) In some embodiments, the upper electrode material and the lower electrode material may also be polysilicon.

In some embodiments, the method provided by the embodiments of the disclosure further includes the following.

At S105, the second semiconductor layers in the first laminated structure are thinned, so as to enlarge the first space to form a second space. The second semiconductor layers in the first laminated structure may be thinned by dry etching or wet etching.

It is to be explained that the operation that the second semiconductor layers in the first laminated structure are thinned refers to that the dimensions in other directions are changed without changing the dimension of the second semiconductor layer in the second direction. That is to say, the overall cross section of the second semiconductor layer in an XZ plane is reduced. During implementation, in-situ oxidization treatment may be performed on the second semiconductor layer first, and then an oxide layer is removed by an etching process, so that the overall cross section of the second semiconductor layer on the XZ plane is reduced.

Figure 4A:
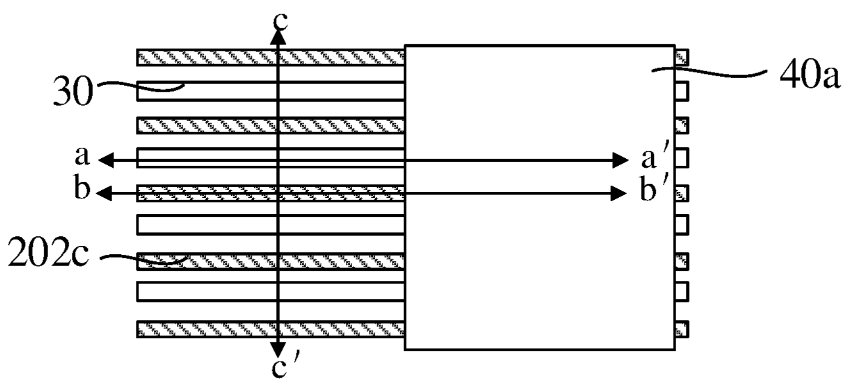
FIG. 4A illustrates another schematic view of a composition structure of a process for forming the capacitor stack structure provided by the embodiments of the disclosure.
Figure 4B:
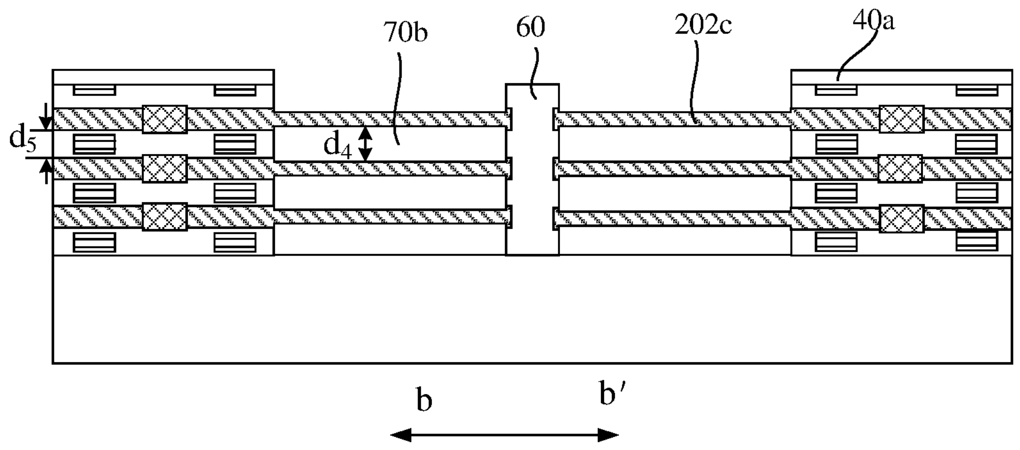
FIG. 4B and FIG. 4C respectively illustrate a sectional view in direction bb' and a sectional view in direction cc' in FIG. 4A.
Figure 4C:
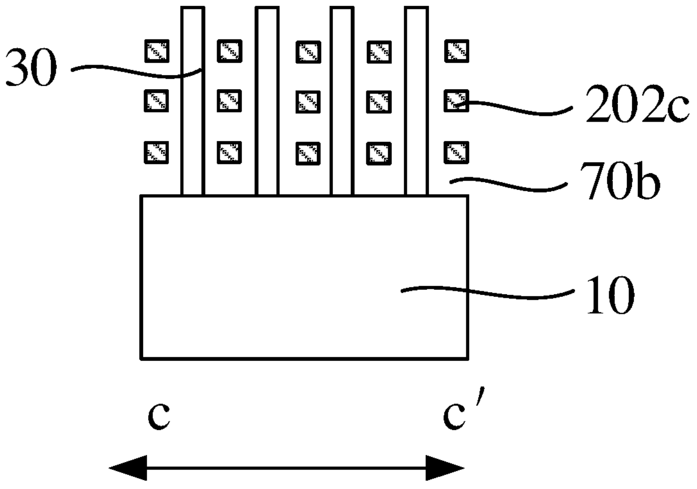

Referring to FIG. 4A, FIG. 4B, and FIG. 4C, the remaining second semiconductor layer (202*b* in FIG. 3J) in the first laminated structure is thinned in the third direction and/or the first direction to form a thinned remaining second semiconductor layer 202*c*, so as to enlarge the first space (referring to 70*a* in FIG. 3J) to a second space 70*b*. Comparing FIG. 3K with FIG. 4C, it can be found that the cross section of the second semiconductor layer 202*c* remaining after being thinned is smaller than that of the second semiconductor layer 202*b* remaining after the first trench is formed by etching.

Referring to FIG. 3J, before the second semiconductor layer in the first laminated structure is thinned, in the third direction, the spacing between the adjacent second semiconductor layers 202*b* remaining after the first trench is formed by etching, is equal to the spacing between adjacent active layers. Referring to FIG. 4B, after the second semiconductor layer in the first laminated structure is thinned, in the third direction, the spacing $d_4$ of the adjacent second semiconductor layers 202*b* remaining after being thinned is greater than the spacing $d_5$ between adjacent active layers. In other words, in the third direction, the thickness of the active layer is greater than the thickness of the second semiconductor layer 202*b* remaining after being thinned.

Correspondingly, the operation S104 in which the capacitor structures are formed in the first space includes the following.

At S1041, capacitor structures are formed in the second space, so as to form a capacitor stack structure.

Figure 4D:
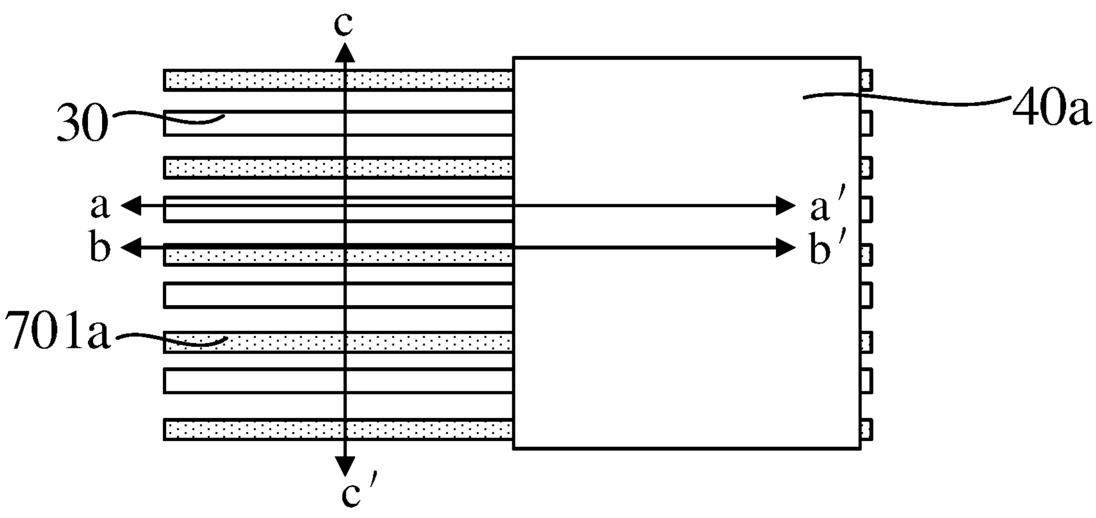
FIG. 4D illustrates another schematic view of a composition structure of a process for forming the capacitor stack structure provided by the embodiments of the disclosure.
Figure 4E:
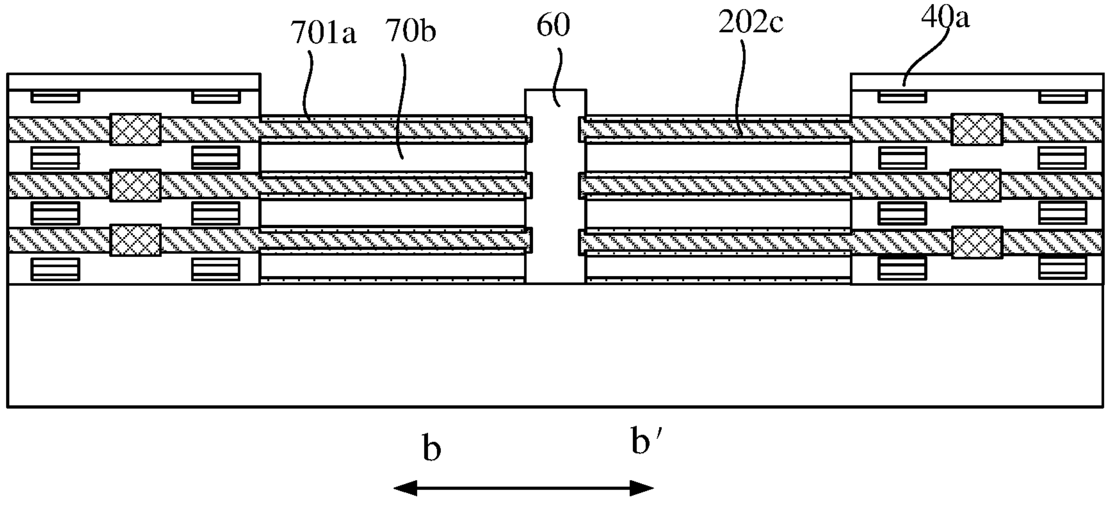
FIG. 4E and FIG. 4F respectively illustrate a sectional view in direction bb' and a sectional view in direction cc' in FIG. 4D.
Figure 4F:
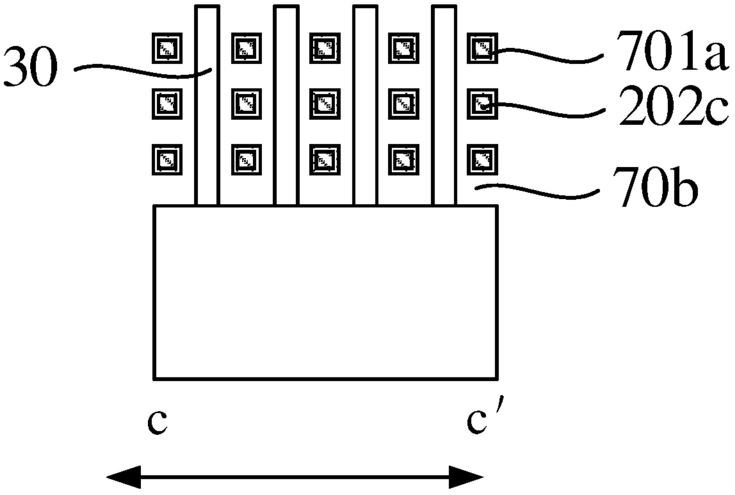
Figure 4G:
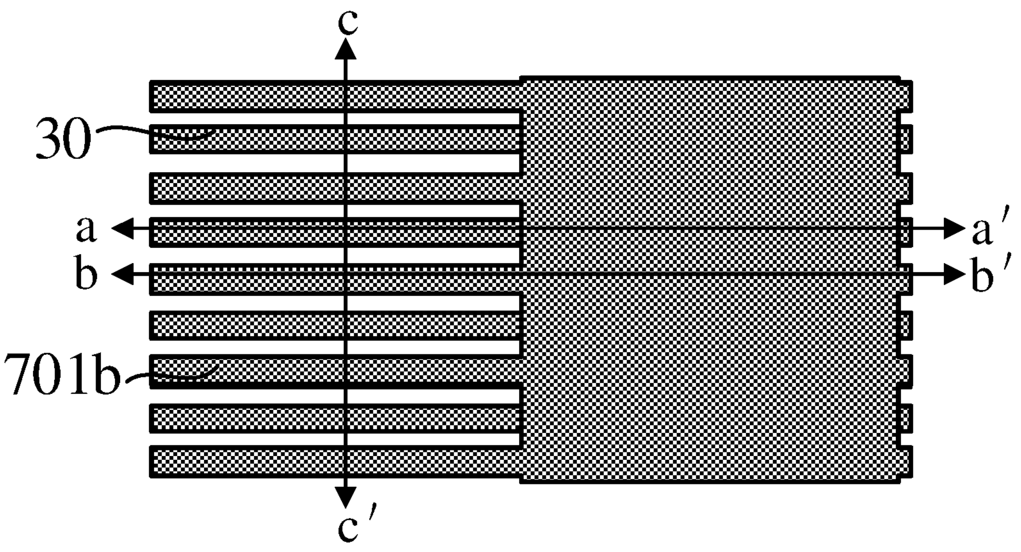
FIG. 4G illustrates a schematic view0 of a composition structure of a process for forming the capacitor stack structure provided by the embodiments of the disclosure.
Figure 4H:
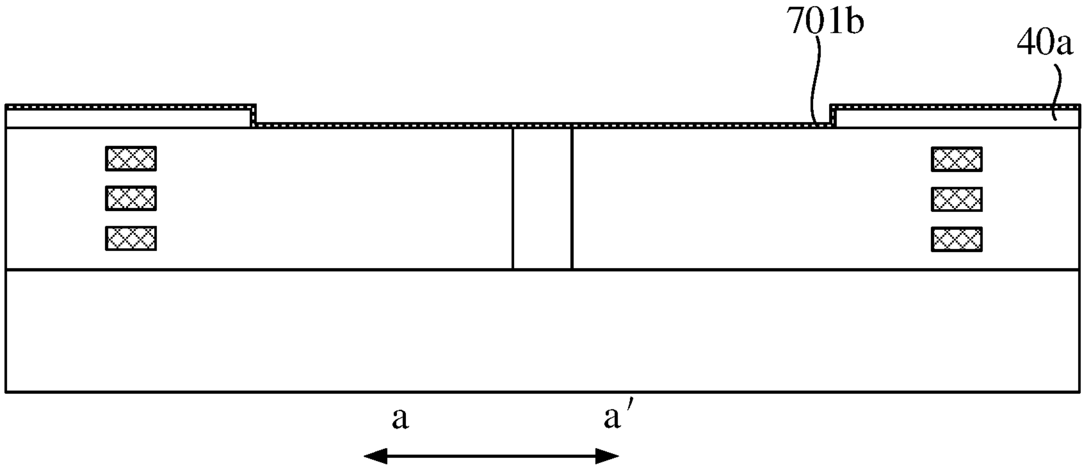
FIG. 4H, FIG. 4I, and FIG. 4J respectively illustrate a sectional view in direction aa', a sectional view in direction bb', and a sectional view in direction cc' in FIG. 4G.
Figure 4I:
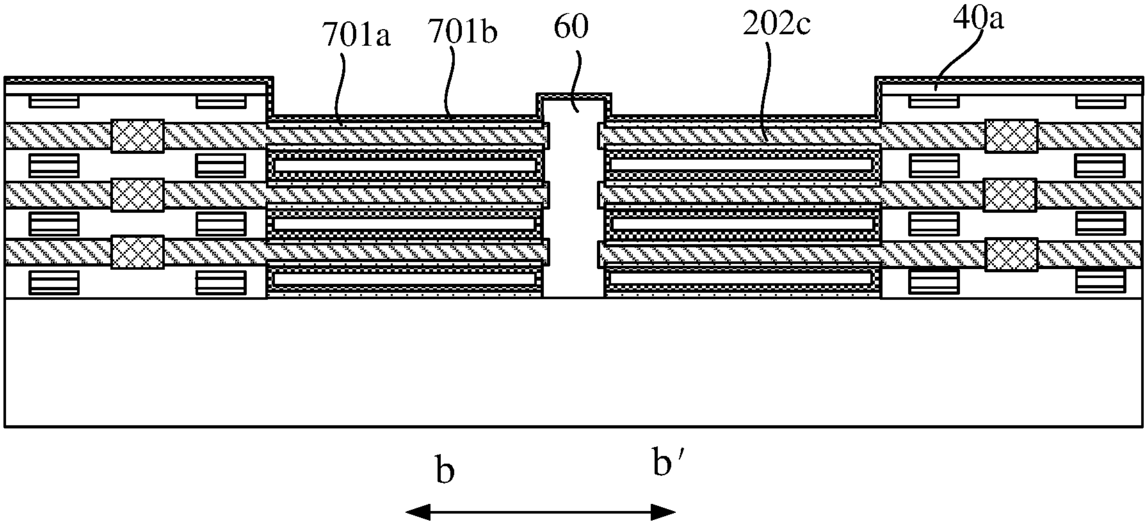
Figure 4J:
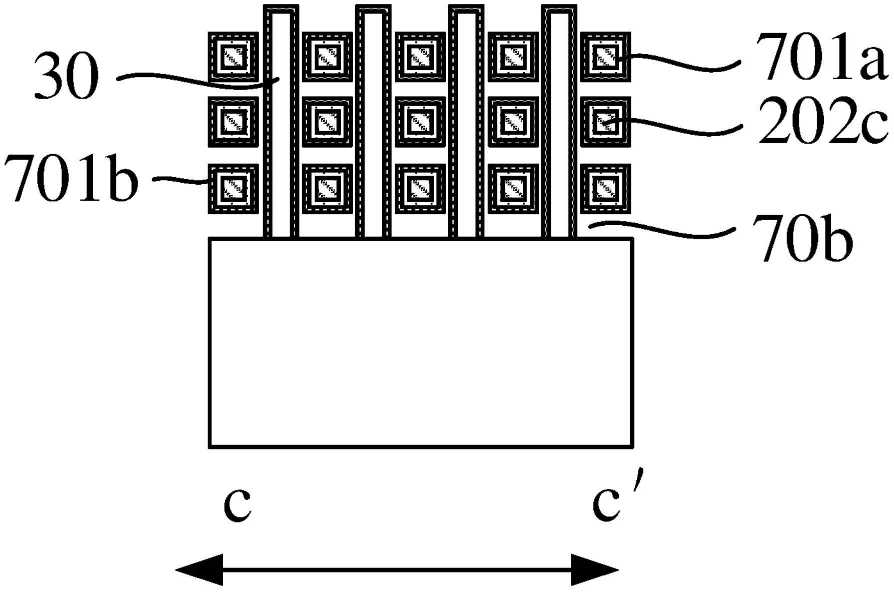
Figure 4K:
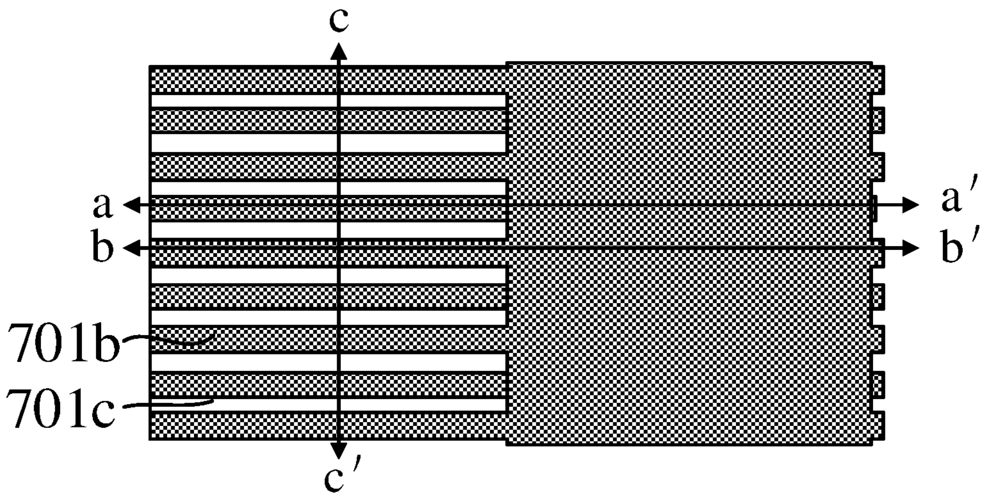
FIG. 4K illustrates a schematic view1 of a composition structure of a process for forming the capacitor stack structure provided by the embodiments of the disclosure.
Figure 4L:
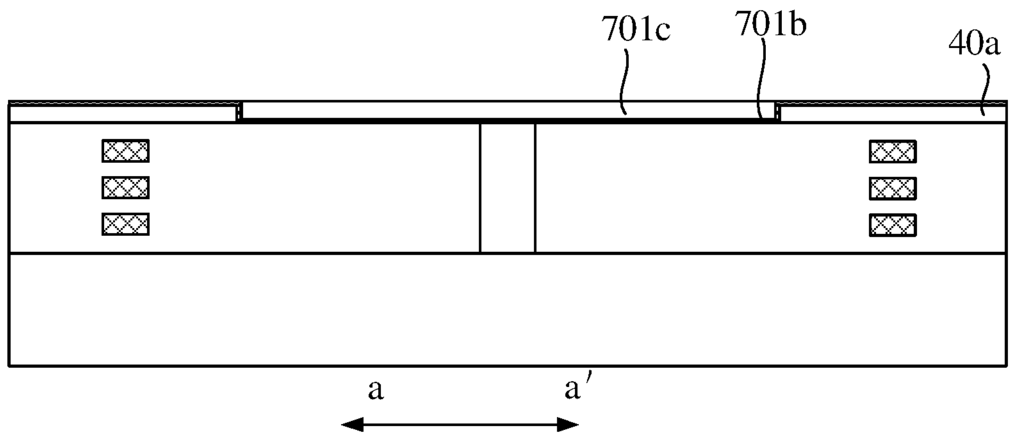
FIG. 4L, FIG. 4M, and FIG. 4N respectively illustrate a sectional view in direction aa', a sectional view in direction bb', and a sectional view in direction cc' in FIG. 4K.

Referring to FIG. 4D, FIG. 4E, and FIG. 4F, the lower electrodes 701*a* are epitaxially formed in the second space 70*b* in sequence, and the sectional view in aa' is similar to FIG. 3G. Referring to FIG. 4G, FIG. 4H, FIG. 4I, and FIG. 4J, a dielectric layer 701*b* is formed on each lower electrode 701*a*.

Referring to FIG. 4K, FIG. 4L, FIG. 4M, and FIG. 4N, an upper electrode material is deposited to form an upper electrode 701*c*, so as to form the capacitor structures 701 and finally to form a capacitor stack structure.

In some embodiments, in the second space, the lower electrode material may be formed by selective growing, and the dielectric material and the upper electrode material may be deposited. In the embodiments of the disclosure, the methods for forming the lower electrode material, the dielectric material, and the upper electrode material are not limited.

In the embodiments of the disclosure, the second semiconductor layer is thinned, so in the third direction, the space between two adjacent second semiconductor layers (that is, the space forming the capacitor structure) will be enlarged. In other words, a larger space may be reserved for the formation of the capacitor structure by thinning the second semiconductor layer, so that the dimension of the capacitor structure may be increased, thereby increasing the capacitance density.

In some embodiments, the method for forming the capacitor stack structure may further include the following.

At S106*a*, ion implantation is performed on the thinned second semiconductor layer. Since the second semiconductor layer will serve as a connection channel between the lower electrode and the active area, the resistance of the second semiconductor layer can be reduced by performing the ion implantation on the thinned second semiconductor layer, thereby reducing the contact resistance between the lower electrode and the active area, and reducing the power consumption of a device.

In some embodiments, the method for forming the capacitor stack structure further includes the following.

At S106*b*, a silicide is formed on the thinned second semiconductor layer. During implementation, a layer of metal, such as any of titanium (Ti), tantalum (Ta), nickel (Ni), tungsten (W), platinum (Pt), and palladium (Pd), may be deposited on the thinned second semiconductor layer. Then, the metal interacts with the second semiconductor layer through rapid thermal annealing, so that a metal silicide is formed on the second semiconductor layer. The metal silicide has low resistance, so the contact resistance between the lower electrode and the active area can be reduced, thereby reducing the power consumption of the device.

In some embodiments, the method for forming the capacitor stack structure may further include both of the following S106*a* and S106*b*. The ion implantation may be performed on the thinned second semiconductor layer and the silicide is formed on the second semiconductor layer, so that the contact resistance between the lower electrode and the active area may be further reduced, thereby further reducing the power consumption of the device.

In some embodiments, the method for forming the capacitor stack structure further includes the following S107*a* and S108*a*.

At S107$a$, the first isolation structure is removed after the second space is formed, so as to form a second trench.

Here, the first isolation structure may be removed by wet etching. An etching solution may be Diluted Hydrofluoric Acid (DHF), or a mixed solution of dilute hydrofluoric acid solution and aqueous ammonia ($NH_4OH$), or a mixed solution including the dilute hydrofluoric acid solution and Tetramethylammonium Hydroxide (TMAH).

Figure 5A:
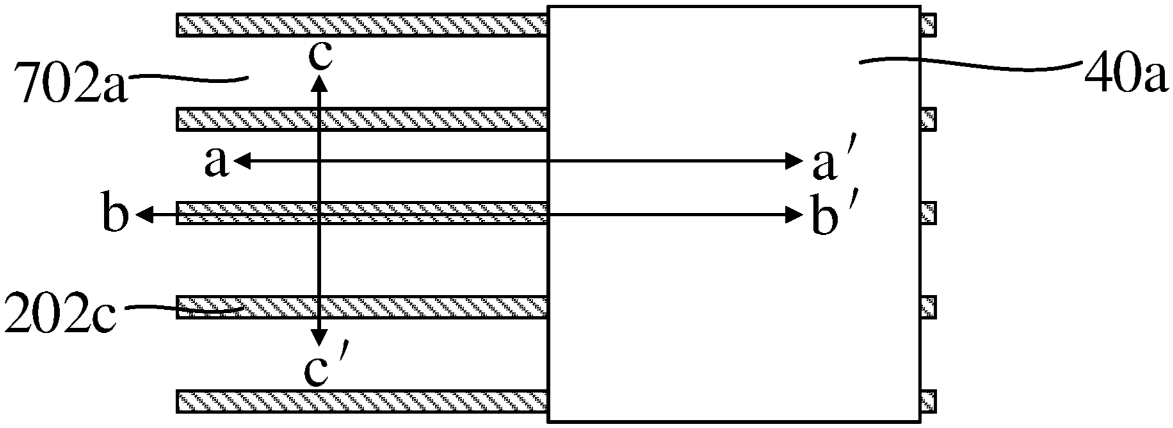
FIG. 5A illustrates a schematic view2 of a composition structure of a process for forming the capacitor stack structure provided by the embodiments of the disclosure.
Figure 5B:
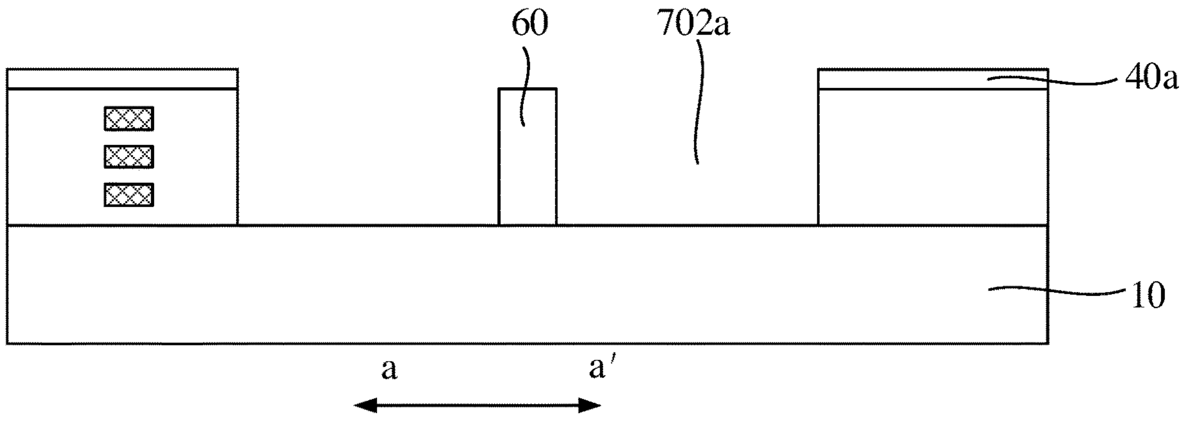
FIG. 5B and FIG. 5C respectively illustrate a sectional view in direction aa' and a sectional view in direction cc' in FIG. 5A.
Figure 5C:
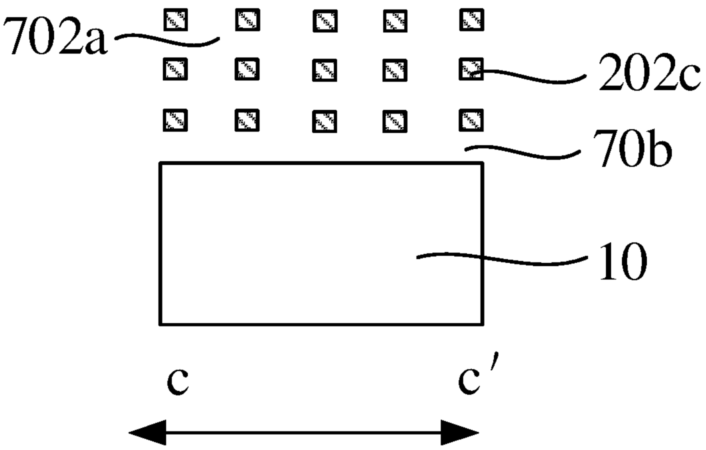

Referring to FIG. 5A, FIG. 5B, and FIG. 5C, the first isolation structure is removed to form a second trench 702$a$. Comparing FIG. 5A with FIG. 4A, it can be found that there is no first isolation structure in FIG. 5A, but there is a second trench 702$a$ formed after the first isolation structure is removed. Since there is no first isolation structure in the sectional view along bb', so the sectional view along bb' is similar to FIG. 4B.

At S108$a$, an upper electrode of the capacitor structure is formed in the second trench.

Figure 5D:
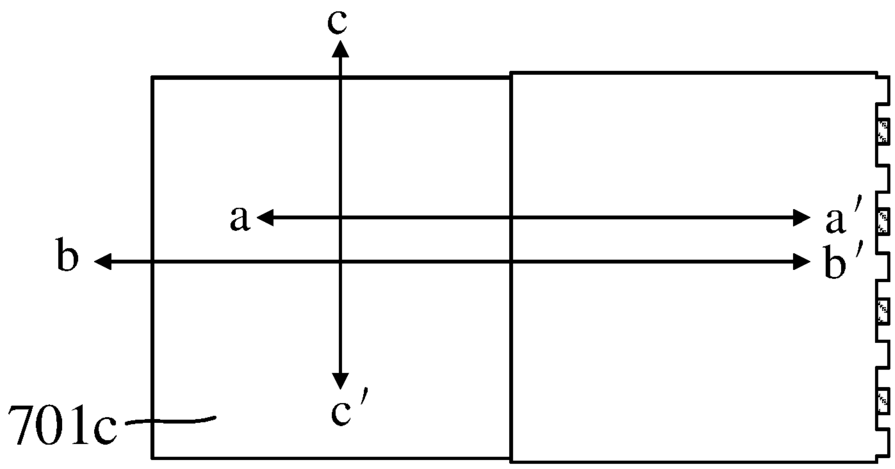
FIG. 5D illustrates a schematic view3 of a composition structure of a process for forming the capacitor stack structure provided by the embodiments of the disclosure.
Figure 5E:
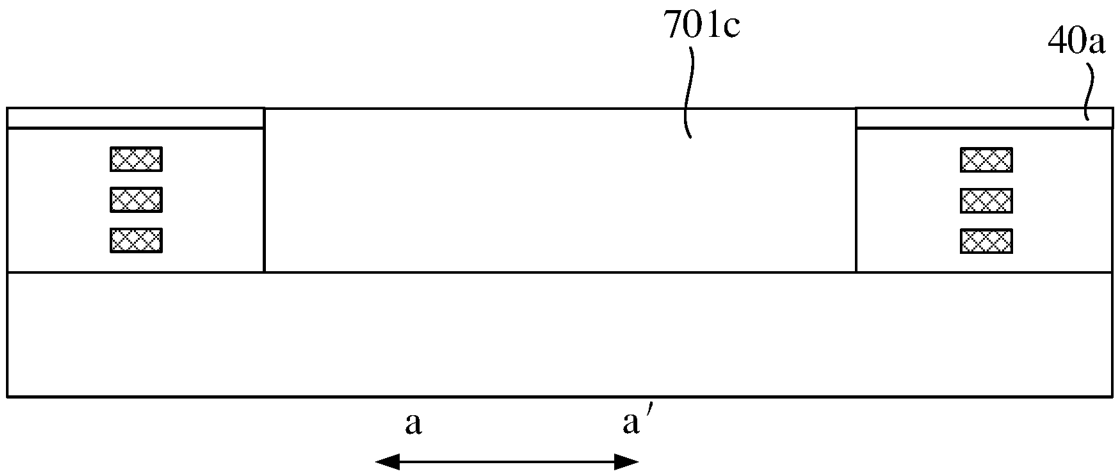
FIG. 5E and FIG. 5F respectively illustrate a sectional view in direction aa' and a sectional view in direction cc' in FIG. 5D.
Figure 5F:
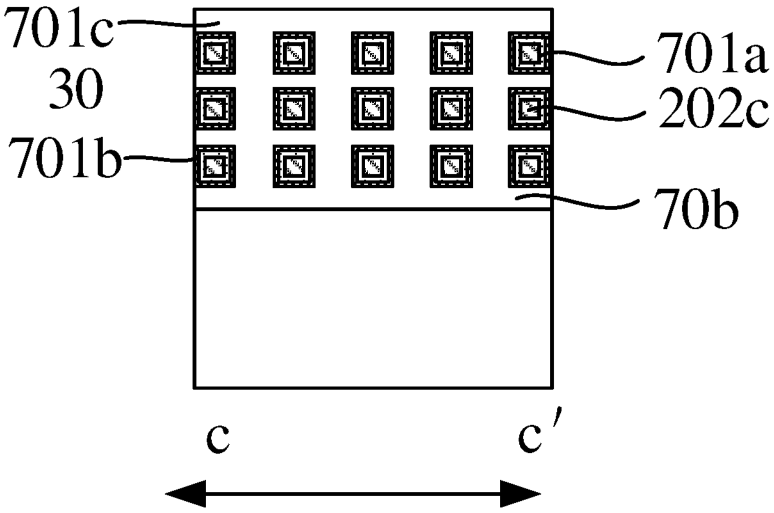

Referring to FIG. 5D, FIG. 5E, and FIG. 5F, the upper electrode 701$c$ is deposited in the second trench 702$a$ (FIG. 5B), the upper electrode in the second trench is connected with the upper electrode located in the second space (or the first space), so the upper electrode 701$c$ may serve as a common upper electrode. It can be seen from FIG. 5F that, the upper electrodes 701$c$ are distributed over all of the cross section cc'.

In the embodiments of the disclosure, the capacitor structures are formed in the second space (or the first space), and the upper electrode of the capacitor structures is formed in the second trench. The upper electrode formed in the trench may support the capacitor structures formed in the second space (or the first space), so that the stability of the capacitor structures can be further improved.

In some embodiments, the method for forming the capacitor stack structure further includes the following S107$b$ and S108$b$.

At S107$b$, at least one of the second semiconductor layers in the first laminated structure are oxidized. The material of each oxidized second semiconductor layer is the same as that of the first isolation structure.

Here, the material of the oxidized second semiconductor layer is the same as that of the first isolation structure, for example, the materials may be silicon oxide. Of course, the material of the oxidized second semiconductor layer may also be different from that of the first isolation structure. The etching selectivity ratio of the material of the oxidized second semiconductor layer to the material of the first isolation structure needs to be close to 1:1, so that the oxidized second semiconductor layer may be removed while the first isolation structure is removed.

At S108$b$, the oxidized second semiconductor layer is removed while the first isolation structure is removed, so as to enlarge the first space to the second space.

Here, since the materials of the oxidized second semiconductor layer and the first isolation structure are the same or the etching selectivity ratio is close to 1:1, the first isolation structure is removed while the second trench is formed, so as to enlarge the first space to the second space, thereby simplifying a process flow while increasing the capacitor formation space.

Figure 6A:
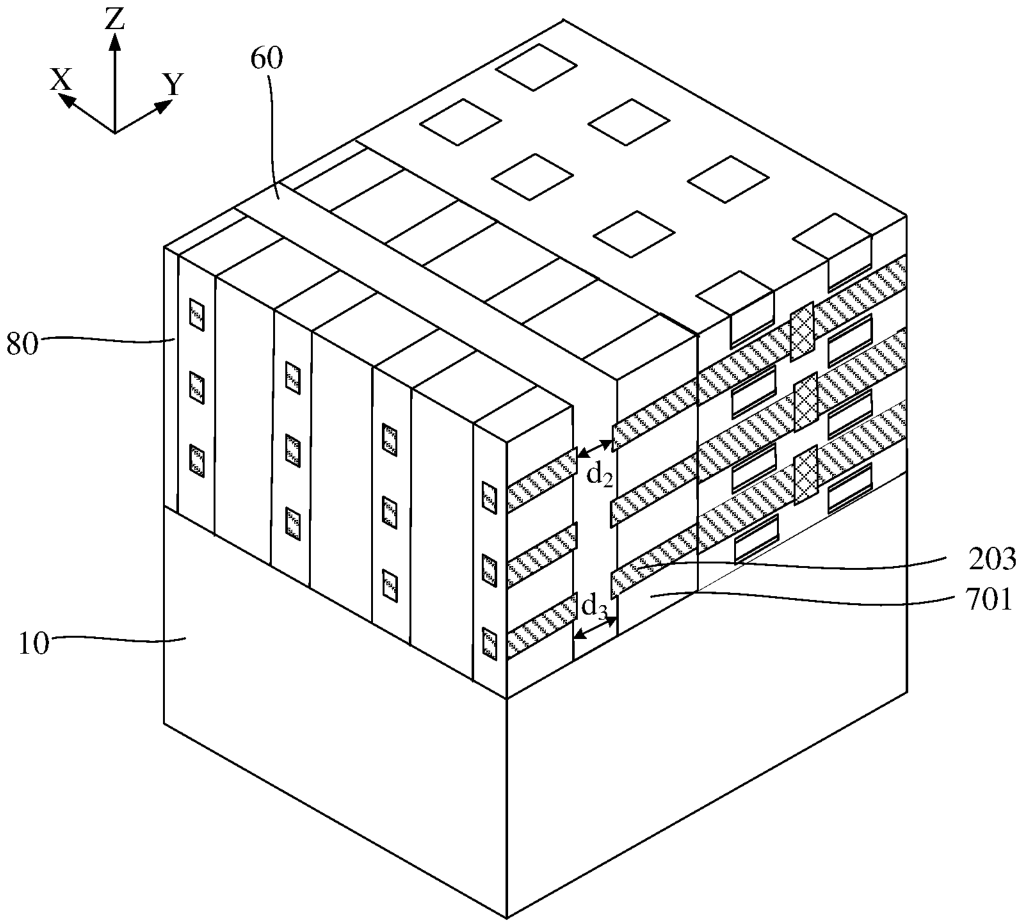
FIG. 6A illustrates a schematic view of a structure of a capacitor stack structure provided by the embodiments of the disclosure.

The embodiments of the disclosure further provide a capacitor stack structure, referring to FIG. 6A, including:

- a substrate 10;
- a support structure 60 that is located on the substrate 10 and extends in the first direction (X-axis direction);
- second semiconductor strips 203 located on two sides of the support structure 60 and arranged in arrays, the second semiconductor strips 203 extending in the second direction (Y-axis direction); and
- a capacitor structure 701, located between two adjacent rows of the second semiconductor strips in the second direction.

The support structure 60 is configured to support the second semiconductor strips 203. The spacing $d_2$ between the two semiconductor strips 203 on different sides of the support structure 60 and in the same row in the second direction is less than the maximum dimension $d_3$ of the support structure 60 in the second direction. Here, the second semiconductor strips 203 may be the second semiconductor layers 202$b$ remaining after the first trench are formed. Referring to FIG. 6A, the second semiconductor strips 203 may also be the second semiconductor layers 202$c$ remaining after the second space is formed, that is, the part remaining after the second semiconductor layers 202$b$ are thinned.

It is to be noted that, the first trench will be formed during forming the capacitor stack structure. In the second direction, the spacing of the adjacent remaining first semiconductor layers is greater than the spacing between the adjacent remaining second semiconductor layers (FIG. 3F). Therefore, the spacing $d_2$ between the two semiconductor strips 203 on different sides of the support structure 60 and in the same row in the second direction (that is, the spacing between the adjacent remaining second semiconductor layers 201$b$ in the second direction) is less than the maximum dimension $d_3$ of the support structure 60 in the second direction.

Figure 4M:
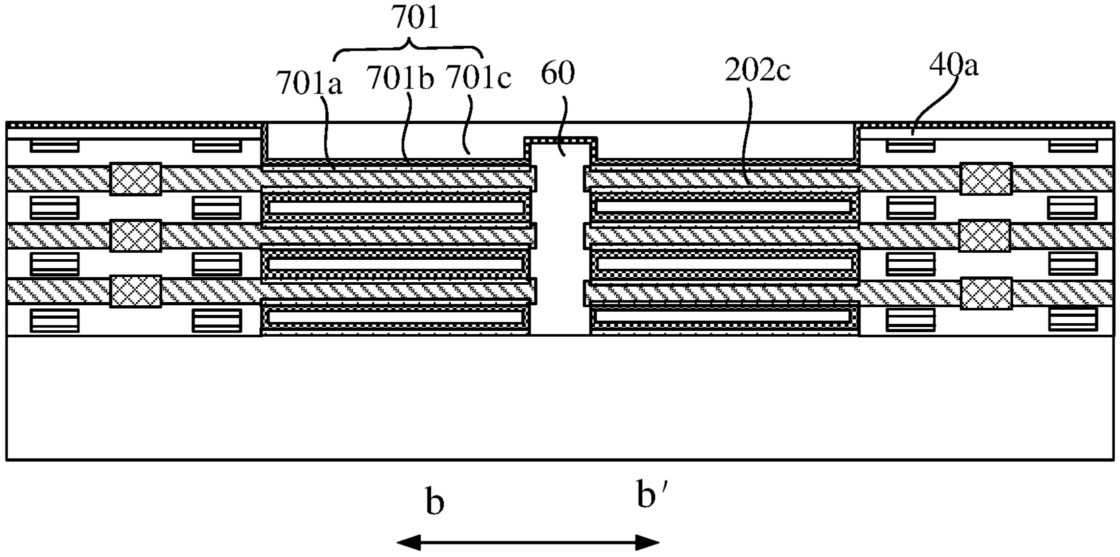
Figure 4N:
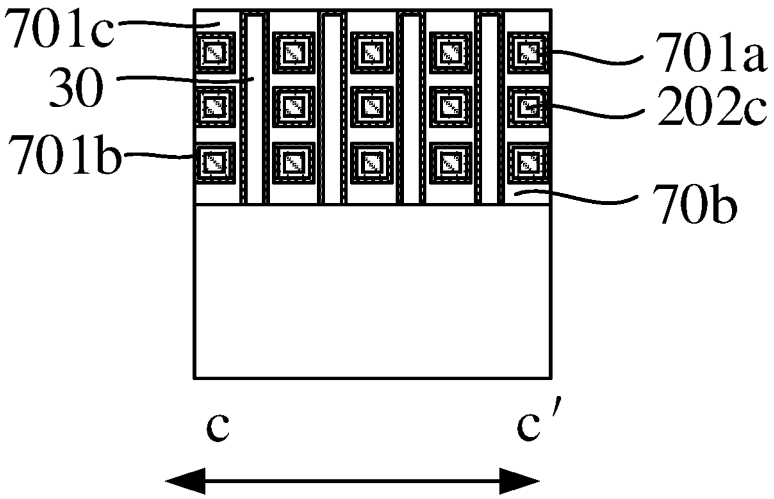

In some embodiments, the structure of the capacitor structure may refer to FIG. 3L, FIG. 4M, or FIG. 5F, and the capacitor structure 701 may include a lower electrode 701$a$, a dielectric layer 701$b$, and an upper electrode 701$c$. Each of the lower electrode 701$a$, the dielectric layer 701$b$ and the upper electrode 701$c$ extends in the second direction.

In the embodiments of the disclosure, there may be or may not be an isolation structure between two adjacent second semiconductor strips in the first direction. When there is no isolation structure, referring to FIG. 6B, an upper electrode 701$c$ may be formed between two adjacent second semiconductor strips 203 in the first direction to support the capacitor structure 701 between two adjacent rows of second semiconductor strips 203 in the second direction, so as to improve the stability of the capacitor structure.

In some embodiments, referring to FIG. 6A, there may be an isolation structure between two adjacent second semiconductor strips 203 in the first direction. Therefore, the capacitor stack structure further includes: a third isolation structure 80. The third isolation structure 80 is configured to isolate adjacent second semiconductor strips 203 in the first direction. The third isolation structure 80 is the remaining part of the first isolation structure after being etched to form the first trench.

Figure 6B:
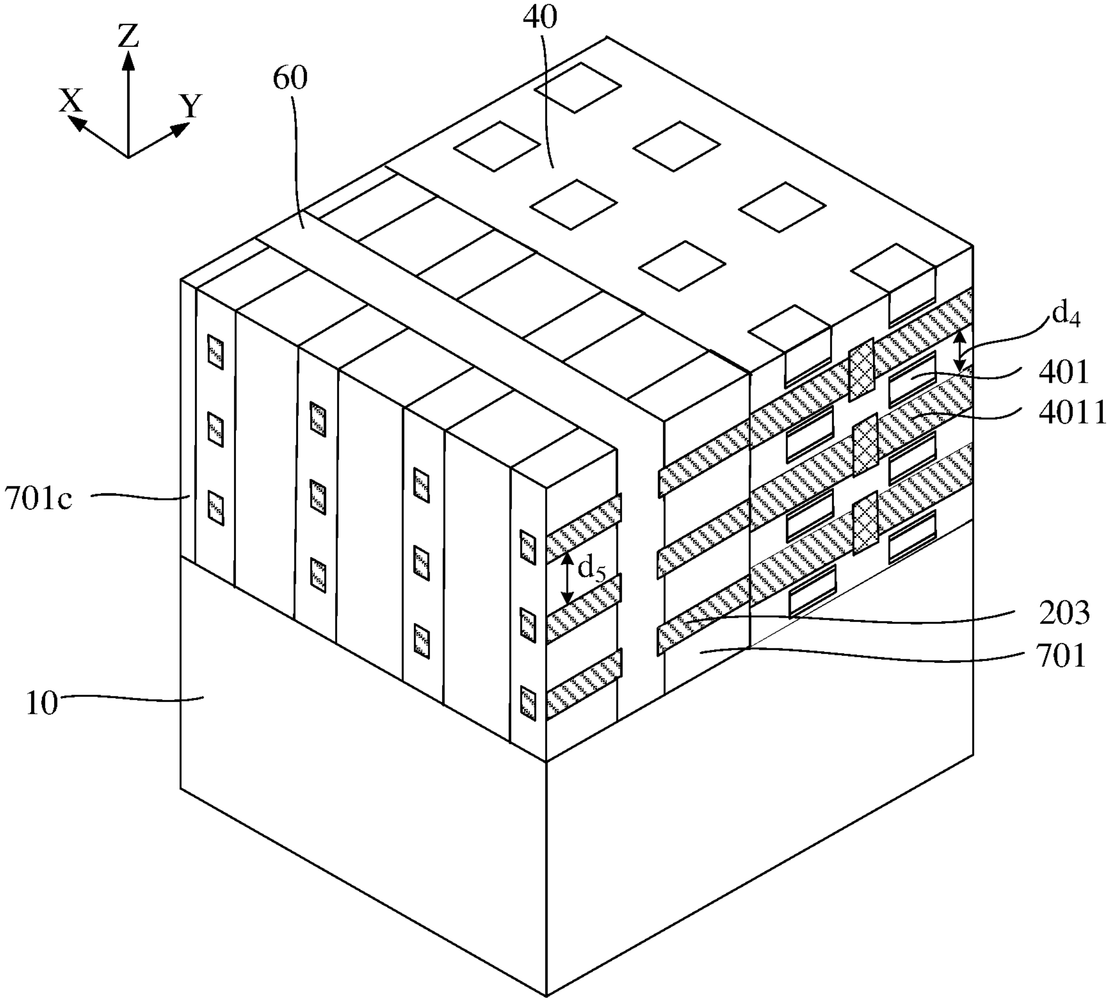
FIG. 6B illustrates another schematic view of a structure of a capacitor stack structure provided by the embodiments of the disclosure.

In some embodiments, referring to FIG. 6B, a transistor area 40 is also formed in the substrate 10. The second semiconductor strip 203 extends to the transistor area 40 to serve as the active layer 4011 of the transistor area 40. The transistor area 40 includes a transistor 401. In the third direction, the spacing $d_4$ between adjacent active layers 4011 is less than the spacing $d_5$ between two adjacent rows of second semiconductor strips 203.

It is to be noted that, the second semiconductor layers in the first laminated structure are thinned during the formation of the capacitor stack structure, so in the third direction, the spacing $d_4$ between adjacent active layers is less than the spacing $d_5$ between the two adjacent rows of second semiconductor strips.

The capacitor structures are located on two sides of the support structure. During implementation, two capacitor structures located on the top may share the upper electrode.

In several embodiments provided by the disclosure, it is to be understood that the disclosed structure and method may be implemented in a non-target mode. The above described structure embodiments are only schematic. For example, the division of the units is only logical function division. In actual implementation, there may be other division modes, for example, a plurality of units or components may be combined, or may be integrated into another system, or some features may be ignored or not implemented. In addition, the components shown or discussed are coupled to each other, or directly coupled.

The abovementioned units described as separate components may be, or may not be physically separated, and the components displayed as units may be, or may not be physical units, that is, they may be located in one place or distributed over a plurality of network units. Some or all of them may be selected according to actual needs to achieve the purpose of the embodiment.

The characteristics disclosed in several method or structure embodiments provided in the disclosure may be freely combined without conflicts to obtain new method embodiments or structure embodiments.

The abovementioned descriptions are only some implementation modes of the disclosure, but the scope of protection of the embodiments of the disclosure are limited thereto. Any variation or replacement readily figured out by a person skilled in the art within the technical scope disclosed in the disclosure shall fall within the scope of protection of the disclosure. Therefore, the scope of protection of the embodiments of the disclosure shall be subject to the scope of protection of the claims.

INDUSTRIAL APPLICABILITY

The embodiments of the disclosure provide a capacitor stack structure and a method for forming the same. The method for forming the capacitor stack structure includes: providing a substrate, a plurality of first laminated structures arranged in a first direction and a first isolation structure located between every two of the first laminated structures being formed on the substrate, and the first laminated structure including first semiconductor layers and second semiconductor layers stacked alternately; forming first trench extending in the first direction in the first laminated structures and the first isolation structures, herein in a second direction, the spacing between the adjacent remaining first semiconductor layers is greater than the spacing between the adjacent remaining second semiconductor layers; forming a support structure in the first trench, and removing the first semiconductor layers from the first laminated structure, so as to form a first space; and forming a capacitor structure in the first space, so as to form a capacitor stack structure. In the embodiments of the disclosure, firstly, the plurality of first laminated structures arranged in the first direction and the isolation structure located between every two of the first laminated structures are formed on the substrate. The first laminated structure includes first semiconductor layers and second semiconductor layers stacked alternately, such that the first isolation structure may be configured to isolate adjacent first laminated structures, which can reduce leakage current. Secondly, the first trench extending in the first direction are formed in the first laminated structures and the first isolation structures, herein in the second direction, the spacing between the adjacent remaining first semiconductor layers is greater than the spacing between the adjacent remaining second semiconductor layers, such that side walls of the first trench may be rugged, and the contact area between a subsequently formed support structure and the second semiconductor layers can be increased, thereby improving a supporting effect of the support structure on the second semiconductor layers and/or the capacitor structure, and reducing the collapse of the capacitor structure. Finally, a support structure is formed in the first trench, and the first semiconductor layers in the first laminated structure are removed, so as to form a first space, and capacitor structures are formed in the first space. The capacitor structures extend in the second direction. In other words, each capacitor structure is parallel to the substrate, that is, the capacitor structure is horizontal. In an aspect, compared with a vertical capacitor structure with a high aspect ratio (that is, the ratio of the height to the width or the diameter), the horizontal capacitor structure can reduce the possibility of toppling or breaking, so as to improve the stability of the capacitor structure; and in another aspect, the capacitor stack structure formed by stacking a plurality of capacitors in the vertical direction can form a three-dimensional memory, which can improve the integration degree of the memory and reduce the dimension of a semiconductor device, thereby realizing miniaturization.

The invention claimed is:

1. A method for forming a capacitor stack structure, comprising:

providing a substrate, on which a plurality of first laminated structures arranged in a first direction and a first isolation structure located between adjacent first laminated structures are formed, wherein the first laminated structure comprises first semiconductor layers and second semiconductor layers stacked alternately;

forming, in the first laminated structures and the first isolation structures, a first trench extending in the first direction, wherein in a second direction, a spacing between the adjacent remaining first semiconductor layers is greater than a spacing between the adjacent remaining second semiconductor layers;

forming a support structure in the first trench, and removing the first semiconductor layers in the first laminated structure to form a first space; and forming capacitor structures in the first space, to form a capacitor stack structure;

wherein the forming first trench extending in the first direction in the first laminated structures and the first isolation structures comprises:

forming, in the first laminated structures and the first isolation structures, a first sub-trench extending in the first direction; and etching, in the second direction, a part of each first semiconductor layer in the first sub- trench in the first laminated structures, to form the first trench.

2. The method of claim 1, further comprising:

thinning the second semiconductor layers in the first laminated structure, to enlarge the first space into a second space;

wherein the forming capacitor structures in the first space to form the capacitor stack structure comprises:

forming the capacitor structures in the second space, to form the capacitor stack structure.

3. The method of claim 2, wherein forming the capacitor structure in the second space to form the capacitor stack structure comprises:

epitaxially forming a lower electrode material in the second space and depositing a dielectric material and an upper electrode material in the second space in sequence, to form the capacitor structures.

4. The method of claim 2, further comprising at least one of:

performing ion implantation on the thinned second semiconductor layers, and forming a silicide on the thinned second semiconductor layers.

5. The method of claim 2, further comprising:

removing the first isolation structure after the second space is formed, to form a second trench; and forming an upper electrode of the capacitor structure in the second trench.

6. The method of claim 2, further comprising:

oxidizing at least one of the second semiconductor layers in the first laminated structure, wherein the material of the oxidized second semiconductor layer is the same as that of the first isolation structure; and thinning the oxidized second semiconductor structure while removing the first isolation structure, to enlarge the first space into a second space.

7. The method of claims 1, wherein providing the substrate comprises:

providing a base;

forming initial first semiconductor layers and initial second semiconductor layers that are stacked alternately on the base, to form an initial first laminated structure, wherein the initial first semiconductor layer comprises an initial silicon germanium layer, and the initial second semiconductor layer comprises an initial silicon layer; and forming, in the initial first laminated structure, the first isolation structures arranged in the first direction, to form the substrate.

8. The method of claim 7, wherein the initial silicon germanium layer wraps the initial silicon layer.

9. The method of claims 7, wherein providing the substrate further comprises:

performing ion implantation on the initial silicon layer after the initial silicon layer is formed on the base.

* * * * *